US012640745B1

(12) United States Patent
Thrasher et al.

(10) Patent No.: US 12,640,745 B1
(45) Date of Patent: May 26, 2026

(54) COMPACT ION MICROWAVE ATOMIC CLOCK

(71) Applicants: National Technology & Engineering Solutions of Sandia, LLC, Albuquerque, NM (US); The Trustees of the University of Pennsylvania, Philadelphia, PA (US)

(72) Inventors: Daniel Adam Thrasher, Albuquerque, NM (US); Peter Schwindt, Albuquerque, NM (US); Roy H. Olsson, III, Philadelphia, PA (US)

(73) Assignees: National Technology & Engineering Solutions of Sandia, LLC, Albuquerque, NM (US); The Trustees of the University of Pennsylvania, Philadelphia, PA (US)

( * ) Notice: Subject to any disclaimer, the term of this patent is extended or adjusted under 35 U.S.C. 154(b) by 18 days.

(21) Appl. No.: 19/022,224

(22) Filed: Jan. 15, 2025

Related U.S. Application Data

(60) Provisional application No. 63/559,279, filed on Feb. 29, 2024.

(51) Int. Cl.
  *H03L 7/26* (2006.01)
  *G04F 5/14* (2006.01)
(52) U.S. Cl.
  CPC ................ *H03L 7/26* (2013.01); *G04F 5/145* (2013.01)
(58) Field of Classification Search
  CPC .................................. H03L 7/26; G04F 5/145

USPC ......................................................... 331/94.1
See application file for complete search history.

(56) References Cited

U.S. PATENT DOCUMENTS

2007/0247241 A1* 10/2007 Braun ...................... G04F 5/14
331/94.1

OTHER PUBLICATIONS

Knab, H. et al., "Ion Trap as a Frequency Standard Measurement of Ba+ HFS Frequency Fluctuations," IEEE Transactions on Instrumentation and Measurement (1985) IM-34(2):242-245.
Schwindt, P. D. D. et al., "A highly miniaturized vacuum package for a trapped ion atomic clock," Review of Scientific Instruments (2016) 87:053112, 9 pages.

* cited by examiner

*Primary Examiner* — Richard Tan
(74) *Attorney, Agent, or Firm* — Mark A. Dodd

(57) ABSTRACT

An atomic clock having a highly integrated vacuum package in combination with a highly integrated and efficient electronics package is disclosed. The vacuum package includes trapping RF electrodes for trapping an ion cloud, optics for guiding an excitation laser beam, an emitter for replenishing ions to the ion cloud, a getter for controlling the vacuum level, and a viewport for admitting the excitation laser beam and transmitting ionic fluorescence. This highly integrated vacuum package occupies a volume of less than 1 mL. The highly integrated and efficient optoelectronics package employs an interposer to which a laser, a photodetector, and various control and drive electronics are attached.

20 Claims, 6 Drawing Sheets

<u>100</u>

<u>100</u>

<u>110</u>

<u>110</u>

145B

120B 150A, 150B

340

140A, 140B

<u>400</u>

| | |
|---|---|
| Place parts in vacuum chamber | 410 |
| Bake/outgas parts | 420 |
| Activate Ba emitters | 430 |
| Backfill vacuum chamber | 440 |
| Stack parts/melt solder | 450 |
| Cool parts to room temperature | 460 |

COMPACT ION MICROWAVE ATOMIC CLOCK

CROSS-REFERENCE TO RELATED APPLICATIONS

This application claims priority to U.S. Provisional Application No. 63/559,279, filed on Feb. 29, 2024, and entitled COMPACT ION MICROWAVE ATOMIC CLOCK, the entirety of which is incorporated herein by reference.

STATEMENT OF GOVERNMENT SUPPORT

This invention was made with Government support under Contract No. DE-NA0003525 awarded by the United States Department of Energy/National Nuclear Security Administration. The U.S. Government has certain rights in the invention.

This research was developed with funding from the Defense Advanced Research Projects Agency (DARPA).

BACKGROUND OF THE INVENTION

Field of the Invention

The present invention relates to a compact and highly integrated atomic clock employing, for example, barium ions (Ba+).

Brief Description of the Related Art

While atomic clocks have been in development for many years, most approaches have a large size, have significant weight, and/or require significant power, i.e., Size, Weight, and Power (SWaP). This greatly limits the applications that can benefit from the extremely high accuracy of atomic clocks. Several approaches have been explored to reduce the SWAP, but these approaches generally still suffer in one or more of the SWAP factors.

Atomic clocks are sensitive to temperature (especially significant temperature changes), magnetic fields, and acceleration or rotation. Atomic clocks employ optical and/or microwave signals for atomic trapping and/or excitation. Depending upon the ion being used, optical signals having the correct wavelength are difficult or inefficient to produce, thereby impacting the SWaP factors.

Thus, the need exists for an atomic clock with low SWAP factors, reduced sensitivity to temperature, magnetic fields, acceleration, and rotation, while employing easy and efficiently generated signals.

SUMMARY OF THE INVENTION

One aspect of the present invention relates to an atomic clock having a highly integrated vacuum package in combination with a highly integrated and efficient electronics package. The vacuum package includes trapping RF electrodes for trapping an ion cloud, optics for guiding an excitation laser beam, an emitter for replenishing ions to the ion cloud, a getter for controlling the vacuum level, and a viewport for admitting the excitation laser beam and transmitting ionic fluorescence. This highly integrated vacuum package occupies a volume of less than 1 mL. The highly integrated and efficient optoelectronics package employs an interposer to which a laser, a photodetector, and various control and drive electronics are attached.

In at least a first embodiment, a miniature trapped ion atomic clock comprises a vacuum package {the vacuum package includes a body (the body including at least one turning mirror that reflects an excitation laser beam toward an ion cloud, one or more emitters that release atoms upon heating of the one or more emitters, a plurality of electrodes that trap the ion cloud, a getter that controls a vacuum level in the vacuum package, and a plurality of electrical feedthroughs that facilitate operation of the one or more emitters and the plurality of electrodes), and a lid (the lid including a viewport that transmits the excitation laser beam and ionic fluorescence emitted by the ion cloud upon excitation by the excitation laser beam)}, an optoelectronics package {the optoelectronics package includes a laser that generates the excitation laser beam, a fluorescence photodetector that detects the ionic fluorescence, a local oscillator (LO) that outputs a clock signal and a radio frequency (RF) signal (the LO including two phase-locked loops (PLLs)), a trap drive that receives the RF signal and amplifies the RF signal using a transformer (the thus amplified RF signal drives one or more of the electrodes), an application specific integrated circuit (ASIC) that implements electrical and control functions required to operate the miniature trapped ion atomic clock, and an interposer wherein the laser, the fluorescence photodetector, the LO, the trap drive, and the ASIC are mounted to the interposer}, and an ionizing source that ionizes the thus released atom (the thus released atoms forming the ion cloud), wherein the optoelectronics package is mechanically, electrically, and optically coupled to the vacuum package.

In various embodiments, at least a first portion of the body is formed of a high temperature co-fired ceramic (HTCC), and at least a second portion of the body is formed of titanium; the one or more emitters are adapted to release Ba atoms; the excitation laser beam has a wavelength of approximately 455 nm; at least one of the plurality of electrodes includes a plurality of holes therethrough (the plurality of holes passes the released atoms and/or the ionized atoms from the one or more emitters to the ion cloud); the getter is a non-evaporable getter; at least a portion of the lid is formed of a non-magnetic material and at least a portion of the viewport is formed of sapphire; at least a portion of the viewport includes an antireflection (AR) coating that passes the excitation laser beam; at least a portion of the viewport includes a bandpass coating that passes the ionic fluorescence and block the excitation laser beam; and the body and the lid are hermetically sealed to one another using a solder.

In other embodiments, the laser is a vertical cavity surface emitting laser (VCSEL); the ionizing source includes one of an ultraviolet (UV) light emitting diode (LED), a UV laser, or a field emitter array; the fluorescence photodetector includes a silicon photomultiplier (SiPM); the optoelectronics package further includes a power photodetector (the power photodetector detects the excitation laser beam after the excitation laser beam passes through the ion cloud); at least one of the two PLLs includes a voltage controlled oscillator (VCO) with a bulk acoustic wave (BAW) resonator; a vibration sensitivity of the BAW resonator is reduced through the use of one or more cantilever anchoring supports; the BAW resonator is formed, at least in part, of a piezoelectric material; the transformer is a piezoelectric transformer; the piezoelectric transformer includes an energy trapping structure; and the interposer includes a printed circuit board (PCB) and/or the interposer employs high density interconnect (HDI) technology.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION OF THE INVENTION

The terms "a" and "an" do not denote a limitation of quantity, but rather denote the presence of at least one of the referenced items. The term "or" means "and/or." The terms "comprising," "having," "including," and "containing" are to be construed as open-ended terms (i.e., meaning "including, but not limited to").

Atomic Clock Physical Configuration

Figure 1A:
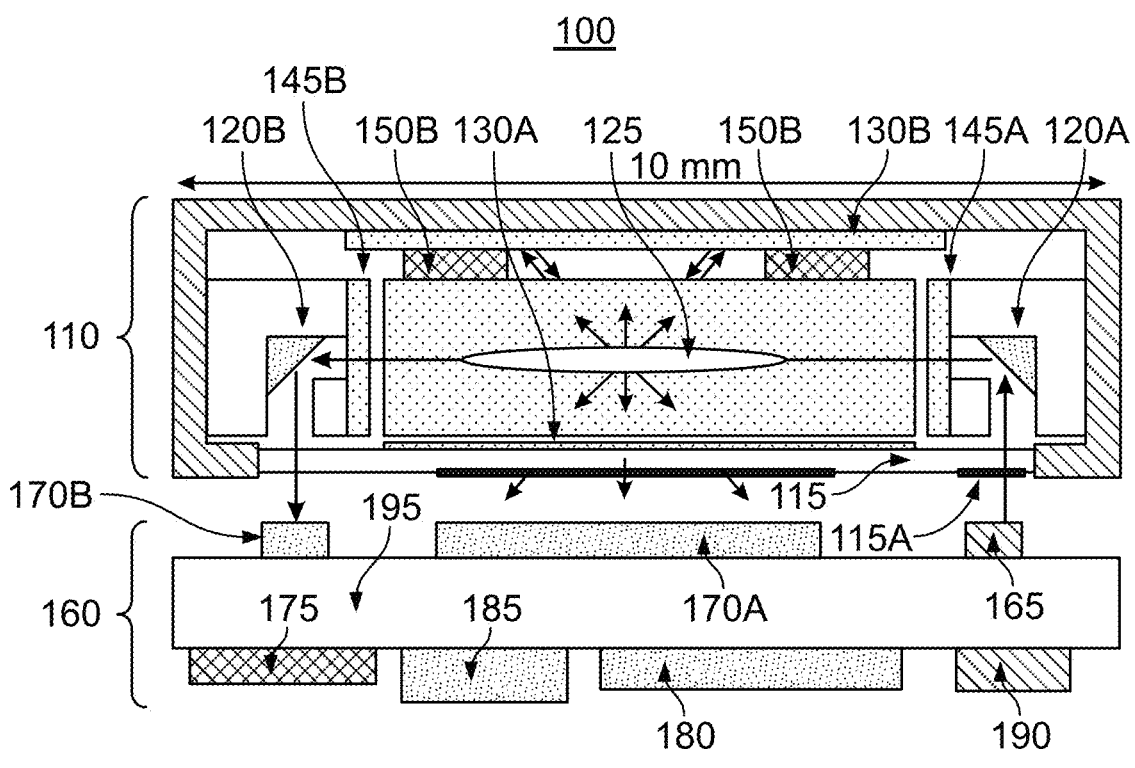
FIGS. 1A and 1B illustrate longitudinal and lateral cross-section drawings, respectively, of an atomic clock in accordance with one or more embodiments of the present invention.
Figure 1B:
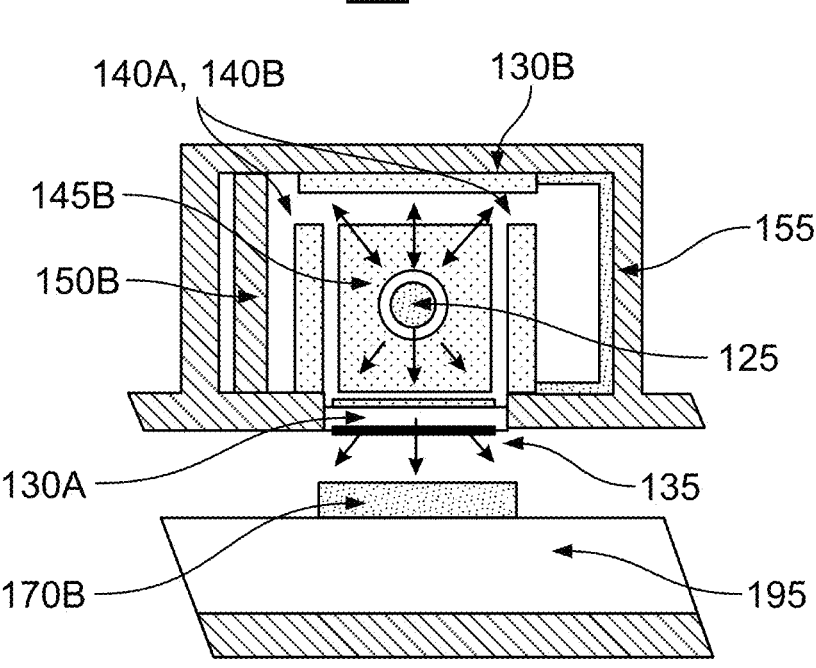

FIGS. 1A and 1B illustrate longitudinal and lateral cross-section drawings, respectively, of an atomic clock 100 in accordance with one or more embodiments of the present invention. The atomic clock 100 includes two primary components: a vacuum package 110 and an electronics package 160. The vacuum package 110 includes a viewport 115 that admits an excitation laser beam that, after being reflected by a first turning mirror 120A, transverses much of the length of the vacuum package 110, thereby passing through an ion cloud 125, formed of Ba+ ions in this embodiment. The viewport 115 may include an antireflection (AR) coating 115A where the excitation laser beam passes through the viewport 115. The viewport 115 further includes a first radio frequency (RF) ground electrode 130A formed of a transparent electrode material. A second RF ground electrode 130B is on the opposite side of the vacuum package from the first RF ground electrode 130A. To improve collection of the ionic fluorescence from the ion cloud 125, the second RF ground electrode 130B may also implement the function of a mirror to reflect the ionic fluorescence toward a fluorescence photodetector 170A, which is part of the electronics package 160. To improve the collection of the ionic fluorescence further, the second RF ground electrode 130B may implement the function of a diffractive optical mirror, there by focusing the ionic fluorescence on the fluorescence photodetector 170A. To improve the signal-to-noise ratio (SNR) from the fluorescence photodetector 170A, a bandpass filter 135 that passes the ionic fluorescence from the ion cloud 125 but blocks any scattered excitation laser beam is formed on the exterior surface of the viewport 115. The excitation laser beam exits the vacuum package 110 via a second turning mirror 120B and the viewport 115.

The vacuum package 110 includes a pair of RF electrodes 140A, 140B on two opposite sides of the ion cloud 125. The pair of RF electrodes 140A, 140B are rotated at an approximately 90° angle with respect to the pair of RF ground electrodes 130A, 130B. The vacuum package 110 also includes a pair of end cap RF ground electrodes 145A, 145B. The net result is that the ion cloud 125 is trapped radially by the surrounding pair of RF ground electrodes 130A, 130B and pair of RF electrodes 140A, 140B, as shown most clearly in FIG. 1B. The ion cloud 125 is further trapped at either longitudinal end by the pair of end cap RF ground electrodes 145A, 145B.

The vacuum package 110 includes one or more emitters 150A, 150B, with emitters 150A, 150B being Ba emitters in the illustrated embodiment. The following description focusses on the use of Ba+ ions, though other embodiments may use other ions, assuming laser sources at the appropriate wavelengths are available. The vacuum package 110 further includes a non-evaporable getter (NEG) 155, which may, for example, be formed on portions of one or more side walls of the vacuum package 110.

The electronics package 160 includes a laser 165 that generates the excitation laser beam that passes through the vacuum package 110. The laser 165 is preferably a vertical cavity surface emitting laser (VCSEL) to simplify overall packaging. While the fluorescence photodetector 170A detects the ionic fluorescence from the ion cloud 125, a power photodetector 170B may be employed to monitor the power of the excitation laser beam after it passes through the ion cloud 125. The electronics package includes a trap drive 175 for driving the pair of RF electrodes 140A, 140B and an application specific integrated circuit (ASIC) 180 for controlling overall operation of the atomic clock 100. The electronics package further includes a local oscillator (LO) comprising a pair phase-locked loops (PLLs) employing a bulk acoustic wave (BAW) voltage controlled oscillator (VCO) 185 and a voltage controlled, temperature compensated crystal oscillator (VCTCXO) 190. Each of the various elements (165-190) of the electronics package 160 is mounted to a double-sided interposer 195, thereby minimizing the volume of the electronics package 160. Operation of the atomic clock 100 will be described next.

Atomic Clock Performance

The time loss over a time interval t of an atomic clock is well approximated by $\delta t(\tau) \approx (A + \sigma(\tau))\tau$, where A is the fractional frequency offset accuracy, $\sigma$ is the fractional frequency instability, and $\tau$ is the integration time. For $\delta t$ to be dominated by $\sigma(\tau)$, A must be less than the minimum of $\sigma(\tau)$. For a given time metric, the required fractional frequency instability $\sigma$ can be estimated. The instability $\delta t$ depends on both the intrinsic instability of the LO and the measurement characteristics of the ions. For pulsed clock operation, the intrinsic stability of the LO is relied upon until ion measurements can be used to steer the LO. Ideally, the LO frequency noise will be less than the ion derived frequency noise at the clock cycle time in order to avoid aliasing.

Figure 2:
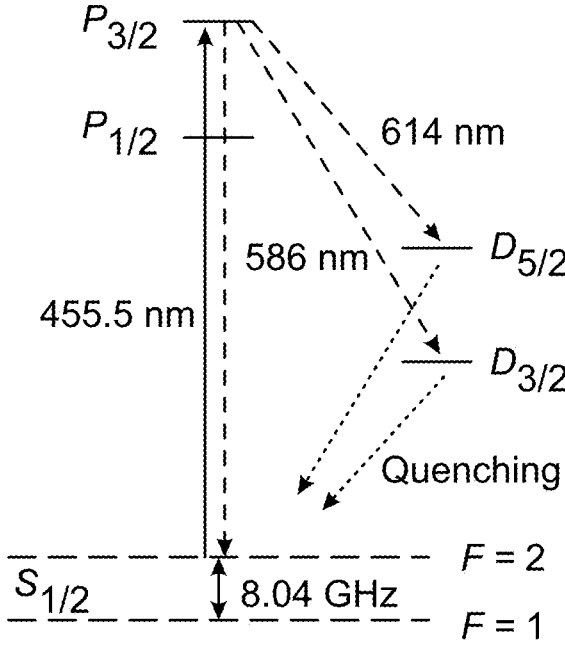
FIG. 2 illustrates the energy level diagram of Ba+ that may be used with one or more embodiments of the present invention.

FIG. 2 illustrates the energy level diagram of Ba+. The $|F,m_F\rangle = |1,0\rangle \rightarrow |2,0\rangle$ transition, referred to as the "clock" transition, is ideal for disciplining a LO because it is first order insensitive to magnetic fields. If the clock transition is interrogated in a pulsed fashion, then the measured clock transition frequency will be independent (to first order) of excitation laser beam power incident to the ions. The clock transition frequency is measured by first illuminating the ions in the ion cloud 125, which begin mostly in the $|1, 0\rangle$ state, for a fixed time with microwave radiation at a frequency $v_{LO}$ tuned near the clock transition resonance. This moves some of ion population in the ion cloud 125, depending on $v_{LO}$, to the $|2, 0\rangle$ state. An excitation laser beam from laser 165, having a wavelength near 455 nm, is pulsed on, thereby exciting the $|2, 0\rangle$ ions into the $P_{3/2}$ state where they either decay back to the ground state manifold emitting a 455 nm photon or to the D-states emitting a photon near 600 nm. The number of photons emitted near 600 nm is proportional to the number of ions in the ion cloud 125 that made the clock transition. Ions in the D-states are quenched back into the ground state manifold by collisions with buffer gas atoms. Once the ions are sufficiently restored back into the $|1, 0\rangle$ state, the laser 165 is turned off, and the process is repeated, but with a new microwave frequency $v_{LO}+\delta$. The difference in measured 600 nm fluorescence signal between the two microwave measurements depends dispersively on $v_{LO}-v_0$, where $v_0$ is the clock transition resonance. When $v_{LO}=v_0-\delta/2$ (i.e., the two microwave frequencies were symmetrically detuned from $v_0$) then the difference in signal is nominally zero. This difference signal is used to stabilize the LO.

The ion derived fractional frequency noise $\sigma_{ions}$ can be written as:

$$\sigma_{ions} = \frac{r}{\pi v_0 SNR}\sqrt{\frac{T_c}{\tau}}, \qquad \text{(Eq. 1)}$$

where $\Gamma$ is the full width at half maximum of the ground state hyperfine transition at frequency $v_0$, SNR is the signal-to-noise ratio, and $T_c$ is the clock cycle time. Based on Yb+ clocks, a linewidth $\Gamma$ of 1 Hz and a clock cycle time of 1 s is reasonable. Evaluating Eq. 1 with $v_0=8$ GHz, $\Gamma=1$ Hz, $T_c=1$ s, and SNR=1, results in an ion derived fractional frequency noise $\sigma_{ions}=4\times10^{-11}$.

The SNR is likely limited by photon counting statistics, and the noise will be dominated by dark counts from the fluorescence photodetector 170A, a silicon photomultiplier (SiPM, see below description). Assuming the noise from detector dark counts is much larger than the signal, the SNR becomes:

$$SNR = \frac{\eta(s, w)\epsilon\xi N}{\sqrt{R_d T_g}}, \qquad \text{(Eq. 2)}$$

where $\eta \approx \tan_{-1}(w/2s)/\pi$ is the fraction of fluorescence photons that strike the fluorescence photodetector 170A, s is the distance from the ions (ion cloud 125) to the fluorescence photodetector 170A, w is the width of the fluorescence photodetector 170A, $\epsilon$ is the quantum efficiency of the fluorescence photodetector 170A, $\xi$ is the number of fluorescent photons scattered per ion, N is the number of trapped ions, $R_d$ is the rate of dark counts of the fluorescence photodetector 170A, and $T_g$ is the time over which the photons are counted. Using the specification from a commercial SiPM, it was determined that $R_d=12$ Mcts/s at 85° C., such that $T_g=150$ us will enable an SNR>1 when measuring the ionic fluorescence from 1000 Ba+ ions measured with a standoff s of 2 mm using a fluorescence photodetector 170A having a width w of 1.5 mm. The SiPM dark count rate roughly doubles for every 7° C. increase in operating temperature. Hence, the SNR at −40° C. will be orders of magnitude greater than the SNR at 85° C. An excitation laser beam intensity at 455 nm of only 1 μW/mm² is estimated to be sufficient for 90% of the ion signal to be fluoresced in 150 μs, and thereby enable an SNR>1 despite a high detector dark count rate $R_d$.

Buffer-gas cooled Ba+ was used to demonstrate a prototype clock in 1985. See, H. Knab et al., "Ion Trap as a Frequency Standard Measurement of Ba+ HFS Frequency Fluctuations," IEEE Transactions on Instrumentation and Measurement, vol. IM-34, pp. 242-245 (1985). Subsequent work on buffer-gas cooled clocks excluded Ba+ due to its lower hyperfine splitting, higher second-order Zeeman coefficient (sensitivity to magnetic field fluctuations), and lower vapor pressure compared to other ion species. Despite these shortcomings, Ba+ may be uniquely suited for an ultrasmall, trapped ion atomic clock. The most compact, power efficient, and narrow linewidth lasers utilize the VCSEL architecture. The D2 optical pumping wavelength of Ba+ (455 nm) is one of the nearest of all ion species trapped to date to a previously demonstrated VCSEL. Additionally, Ba+ fluoresces strongly at 614 nm when optically pumped with only 455 nm light, as illustrated in FIG. 2. As a result, a thin film interference optical bandpass filter 135 passing ionic fluorescence at 614 nm, located before the fluorescence photodetector 170A, is sufficient to prevent scattered excitation laser beam photons from adding to the detection background.

A difficult aspect of Ba+ ions is the long lifetime of the D-states (>10 s). Collisions with the buffer gas quench the ions in the D-states, re-initializing them into the ground state manifold. The time required for re-initialization determines the dead time of the clock, which contributes to the clock cycle time $T_c$ (see Eq. 1). Helium, for example, quenches the D-states with a rate coefficient of 320,000/s/Torr such that a quench rate of 32/s can be achieved with $10^{-4}$ Torr of He. This is more than an order of magnitude more buffer gas pressure than may typically be used with a $^{171}$Yb+ ion-based atomic clock. Other buffer gases may be used (in addition or as an alternative to He) to enhance the quench rate per unit pressure and minimal ground-state hyperfine frequency shift or decoherence while being compatible with the NEG 155.

Finally, because the lowest hyperfine ground state of $^{137}$Ba+ has angular momentum of F=1, there are three Zeeman states that will be populated due to buffer gas collisional quenching, as illustrated in FIG. 2. Only ions in the $|1, 0\rangle$ state will contribute to the clock transition measurement. However, after a few clock cycles, most of the ions will accumulate in the $|1, \pm1\rangle$ states. To clear the ion population from these states, microwaves may be applied to transfer ions in the $|1, \pm1\rangle$ states to the F=2 manifold during the optical pumping process with the excitation laser beam. This will allow population to accumulate mostly in the |1, 0) state. The individual components of the atomic clock 100 will be described next and compared with the prior art.

Fluorescence Photodetector

Buffer-gas cooled atomic clocks typically utilize a photomultiplier tube (PMT) in order to count photons which have fluoresced from the trapped ions. While these devices have low dark count rates, their volume is well in excess of 1 mL, and they require a high operating voltage. A more compact sensing alternative is the SiPM. A SiPM requires only a modest operating voltage (~30 V) and can be very compact. However, the dark count rate in a SiPM per sensor active area is not only orders of magnitude greater than a PMT but is also strongly temperature dependent. Despite these shortcomings, the high dark count rate can be mitigated by (1) mounting a SiPM detector (the fluorescence photodetector 170A) as close as possible to the ion cloud 125, (2) by potentially installing a diffractive optical mirror (part of the functionality of the second RF ground electrode 130B) to increase fluorescence collection efficiency, and (3) by illuminating the ion cloud 125 with an excitation laser beam having sufficient power to reduce the measurement gate time without sacrificing signal. Because a dielectric optical coating (bandpass filter 135) is employed to pass only the ionic fluorescence to the SiPM (fluorescence photodetector 170A), the SiPM cannot easily be installed within the vacuum package 110. Thus, the SiPM (fluorescence photodetector 170A) will be installed directly behind the viewport 115, whose inner face is coated with indium tin oxide (ITO), or other transparent contact material, while the outer face has a dielectric coating. In this configuration, the viewport 115 doubles as the first RF ground electrode 130A and the bandpass filter 135 for ionic fluorescence detection, as illustrated in FIG. 1A.

Vacuum Package

At the heart of the atomic clock 100 is a linear RF Paul trap contained within a highly miniaturized vacuum package 110. The vacuum package 110 has a titanium body and a high temperature co-fired ceramic (HTCC) substrate, onto which all of the internal components were mounted (see FIGS. 1-3 in P. D. D. Schwindt et al., "A highly miniaturized vacuum package for a trapped ion atomic clock," Review of Scientific Instruments, vol. 87, art. no. 053112 (2016)). In addition to the various RF electrodes 130A, 130B, 140A, 140B, 145A, 145B, the internal components include the emitters 150A, 150B, and the NEG 155. The NEG 155 pumps all gases except noble gases (and methane) to maintain a clean helium atmosphere at a few μTorr pressure. HTCC is a material system that allows metal traces and vias to be fabricated with ceramic layers much like a standard printed circuit board. It is ideal for containing a miniature ion trap because it enables very compact electrical feedthroughs, it can be formed in a variety of shapes with a flexible electrical trace pattern, and it can undergo a variety of high temperature processing steps, such as brazing and soldering to attach components and baking to achieve clean vacuum conditions.

Figure 3A:
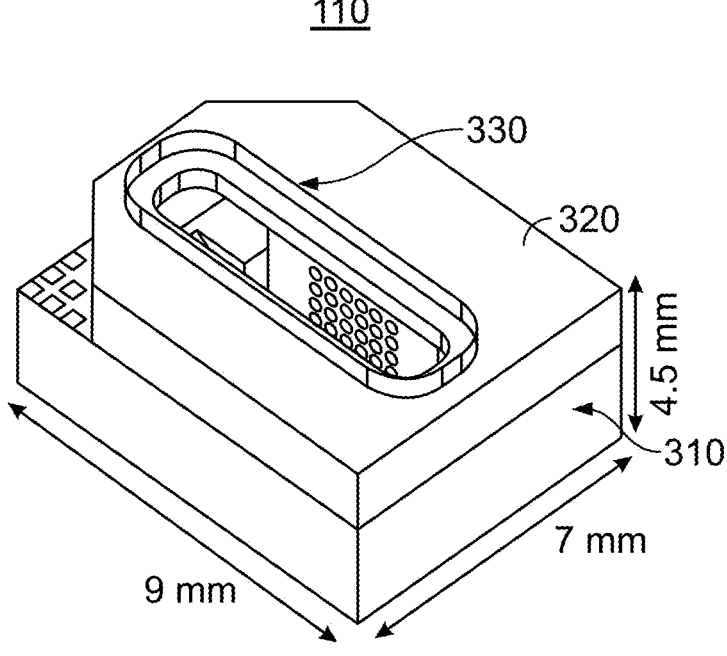
FIGS. 3A and 3B illustrate a vacuum package that may be used with one or more embodiments of the present invention.
Figure 3B:
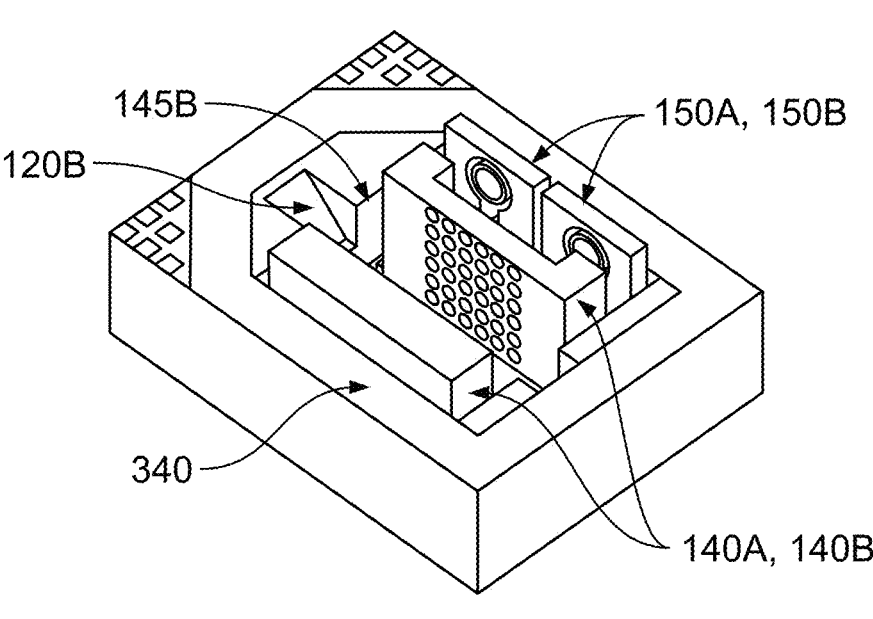

To reduce the volume of the vacuum package in Schwindt 2016 while maintaining functionality, the number of viewports 115 has been reduced to one in the vacuum package 110, and the amount of metal minimized in the titanium body and HTCC substrate. FIG. 3A illustrates an exemplary 300 mm$^3$ vacuum package 110. The vacuum package 110 exterior consists of 1) the HTCC body 310, to which all of the internal components are attached, 2) a lid 320, which can be either non-magnetic metal or alumina, and 3) a sapphire window 330 (viewport 115), through which the 455 nm excitation laser beam enters the vacuum package 110 and the ionic fluorescence exits the vacuum package 110. One key factor in the choice of materials used to form the external portions of the vacuum package 110, i.e., the body 310, the lid 320, and the viewport 115, is low helium (He) permeability. Helium passes through all glass materials at some level, eventually spoiling the vacuum since it cannot be pumped by a getter material. For this reason, sapphire was chosen as the material for the viewport 115 because it has no measurable He permeability. Metal typically has no He permeability, while HTCC (92% alumina, 8% glass) has a He permeation rate where the lifetime of the vacuum package 110 is expected to exceed 100 years. Differences relative to Schwindt 2016 include: 1) taller RF electrodes 140A, 140B (compare FIG. 5 of Schwindt 2016 with FIG. 1B), resulting in more uniform confinement of the ion cloud 125; 2) a transparent conductive film on the viewport 115 to form the RF ground electrode 130A, also resulting in more uniform confinement of the ion cloud 125; 3) perforation of RF electrode 140A, as illustrated in FIG. 3B, to allow the neutral Ba vapor to pass therethrough; and 4) a shortened length to reduce size. With the transverse dimensions of the vacuum package 110 being largely unchanged from Schwindt 2016, and the length shortened from 8.2 mm to 5 mm, approximately half the number of Ba+ ions (~5,000) are expected to be trapped. A further difference is the mounting, within the vacuum package 110, of a pair of turning mirrors 120A, 120B to steer the excitation laser beam along the axis of the vacuum package 110, and thus the ion cloud 125. The inner walls of the lid 320 are coated with a thin film of NEG 155, though foils coated with NEG may be used in some embodiments. This approach maximizes the surface area of the NEG 155, while limiting its volume.

Figure 4:
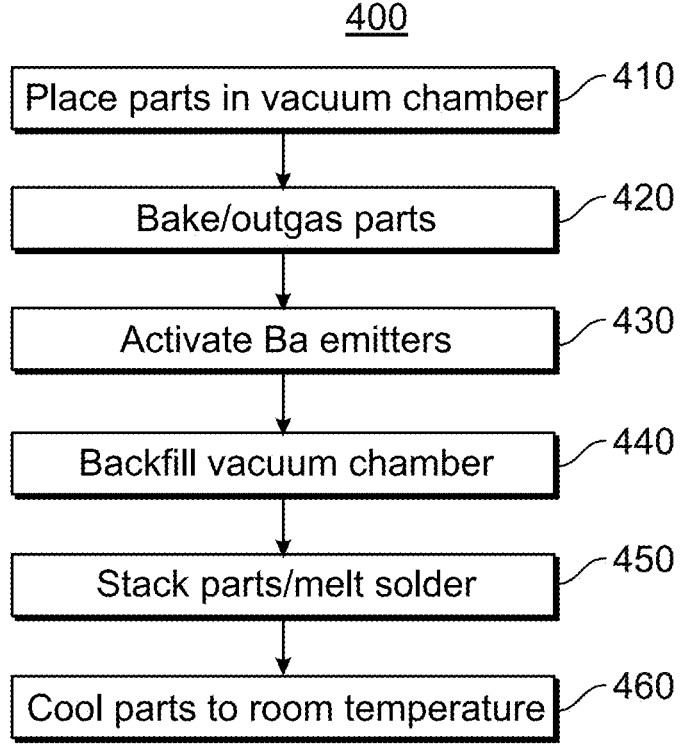
FIG. 4 is a flow chart illustrating an exemplary method of hermitically sealing one or more embodiments of the present invention.

A further significant change from the vacuum package in Schwindt 2016 is how the vacuum environment is achieved and how the vacuum package 110 is hermetically sealed. The small size of the vacuum package 110 precludes the use of evacuating the vacuum package 110 through a copper "pinch-off" tube, which was used in Schwindt 2016. Sealing the vacuum package 110 will be undertaken within a vacuum chamber. The HTCC body 310 and the lid 320 (with the viewport 115) will be joined with a solder such as an Au—Sn eutectic alloy (melting point: 278° C.). A flowchart of the hermetic sealing process 400 is illustrated in FIG. 4. In step 410, the HTCC body 310 and the lid 320 (with the viewport 115) are mounted separately in a vacuum chamber, with a AuSn solder preform placed on a seal ring 340 (see FIG. 3B), i.e., peripheral edge, of the HTCC body 310. In step 420, the temperature of the HTCC body 310 and the lid 320 (with the viewport 115) is raised to somewhat below the melting temperature of the AuSn solder for several hours to several days to bake/out-gas the components. It may be advantageous to heat the lid 320 (with the viewport 115) to a temperature in excess of 300° C., because while the material forming the NEG 155 begins to activate at 180° C., fuller activation over a shorter time can be achieved at a higher temperature. In step 430, the Ba emitters 150A, 150B are activated to their operating temperature for a short time to substantially out-gas them. In step 440, the vacuum chamber is back-filled with the appropriate pressure of buffer gas. In step 450, the HTCC body 310 and the lid 320 (with the viewport 115) are brought together and the temperature is raised above the melting temperature of the AuSn solder. In step 460, the vacuum package 110 is cooled back to room temperature and is removed from the vacuum chamber.

Attachment of the internal components to the HTCC body 310 may also be accomplished with solder alloys. Because the melting temperature of AuSn solder joints on gold pads increases after first reflow of the AuSn solder, it may be possible to first attach the internal components and then later hermetically seal of the vacuum package 110 using AuSn solder in both steps. In other embodiments, higher melting point solder alloys of AuSn, AuIn (485° C.), AuSi (363° C.), and/or AuGe (356° C.) may be employed. These higher melting point solder alloys may also be employed with the hermetic scaling process 400 to allow a higher bake temperature for the components to further improve the vacuum conditions of the vacuum package 110. However, AuSn solder is a proven technology and widely used in the microelectronics industry. A laser solder jetting tool, for example, may be employed for precision AuSn solder placement and die/component attach.

Ba Emitters

The ion trap is loaded by first sublimating isotopically purified neutral $^{137}$Ba atoms from the Ba emitters 150A, 150B and then ionizing the $^{137}$Ba atoms. Prior research demonstrated a 6 mm$^3$ microfabricated Si hotplate required 260 mW to dispense Yb. Because this power is only required for 10 minutes every few days, the time averaged power draw to load the trap is less than 1 mW. The Si hotplates can similarly be used to dispense Ba atoms, and thus form the basis for the Ba emitters 150A, 150B. The vapor pressure of Ba is approximately 10× lower than Yb, so the Ba emitters 150A, 150B will need to be operated about 50° C. hotter than the Si hotplates for Yb. To load Ba+ ions in the ion trap, neutral Ba can be ionized via electron impact. A simple technique is to liberate electrons from the surfaces of the Ba emitters 150A, 150B via the photoelectric effect by illumination with an ionizing light source, for example, an ultraviolet (UV) light emitting diode (LED) or laser (not illustrated in FIG. 1, but located adjacent the fluorescence photodetector 170A). Other embodiments may use alternative ionizing sources, for example, a field emitter array mounted within the vacuum package. The prior art demonstrated this technique worked well with Yb. Such an ionizing light source would consume a few hundred mW, but the time averaged power is again less than 1 mW, since ion loading occurs rarely.

A substantial issue with Ba is that it rapidly oxidizes in air. Thus, filling the Ba emitters 150A, 150B with Ba, affixing them and other components within the vacuum package, and hermetically sealing the vacuum package will be much more complicated than with Yb (which shows little oxidation). Thus, a custom system to eliminate exposure of Ba to air during all of the processing steps is likely required. This custom may, for example, include a vacuum chamber within a glove box filled with an argon atmosphere. For filling the Ba emitters 150A, 150B, a micro-evaporator setup (see, for example, FIG. 8 of Schwindt 2016) would be prepared with milligram pieces of natural Ba or $^{137}$Ba in the glove box and then transferred into the vacuum chamber for evaporation into the Ba emitters 150A, 150B. The same vacuum chamber could also be used for the soldering and/or hermetic sealing process steps. The custom vacuum chamber will require a heater and temperature sensors that can reach approximately 800° C. for the Ba evaporation, custom fixturing for each processing step, motion feedthroughs and translation stages to align the lid 320 to the HTCC body 310, and gas handling to introduce the buffer gas.

455 nm VCSEL

The specifications for the laser 165 for the atomic clock 100 are given in Table 1. The required blue wavelength (~

455.4 nm) is near the peak of the efficiency curve for InGaN/GaN materials, with LEDs, edge-emitting diode lasers (EEDLs), and VCSELs commercially available in this spectral region. An optical output power of only 0.5-1.0 mW is more than sufficient to satisfy the required power density of ~1 µW/mm$^2$ in the ion cloud 125.

TABLE 1

| Laser Specifications. | |
| --- | --- |
| Parameter | Specification |
| Wavelength (nm) | 455.4 |
| Optical Output Power (mW) | 1.0 |
| Power Consumption (mW) | 15 |
| Linewidth (pm) | 1 |
| Package Volume (mm$^3$) | 50 |
| Mode Requirement | Single |
| Mode-Hop-Free Tuning Range (pm) | >100 |
| Side Mode Suppression Ratio (dB) | 25 |
| Polarization | >90% Linear |
| Pulsed Current Rate (kHz) | 0.001-1 |

Local Oscillator

Figure 5:
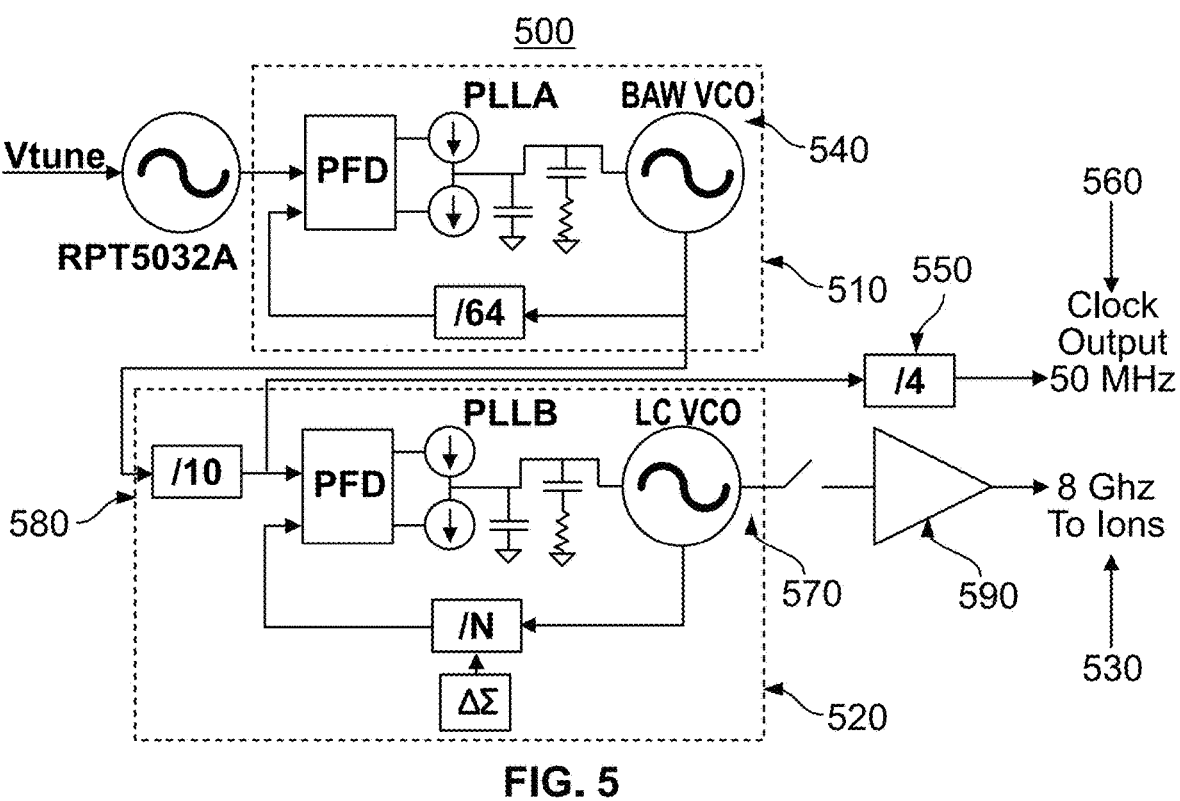
FIG. 5 illustrates a local oscillator (LO) that may be used with one or more embodiments of the present invention.

In order to enable interrogation of the ions for long-term clock accuracy while also producing an output clock that is resilient to vibration, various embodiments employ two phase-locked loops (PLLs) in series, as part of the LO 500 as illustrated in FIG. 5. The first PLL (PLLA) 510 targets a constant output frequency that is robust to vibration effects and that is tuned by the ion interrogation feedback. The second PLL (PLLB) 520 employs a divided version of the output clock from the PLLA 510 as its input reference and employs a fractional-N divider to enable variation of an 8 GHz output 530 for ion interrogation. Both PLLs 510, 520 may be implemented on the same CMOS die. Core 1V circuits may be protected from supply noise by employing low drop out (LDO) regulators on-chip.

PLLA 510 may employ a frequency reference derived from a commercial off the shelf (COTS) temperature compensated crystal oscillator (TCXO). The TCXO is small (5×3.2×1.75 mm$^3$), has a low power consumption of less than 5 mW, and has an Allan deviation of $5\times10^{-11}$ at 1 s. The preferred TCXO is voltage controlled tunable, i.e., a VCTCXO, such that its frequency can be locked to the atomic transition at timescales exceeding 1 s. The frequency of the VCTCXO can be pulled by ±7 ppm, which is nearly sufficient to cover, for example, a ±5 ppm maximum aging plus a ±2.5 ppm maximum temperature drift. The acceleration sensitivity of a COTS VCTCXO may be too great for certain applications, thereby necessitating use of an alternative, low vibration sensitivity reference.

In PLLA 510, a CMOS integer-N PLL may be employed utilizing a bulk acoustic wave (BAW) resonator load for the PLL voltage controlled oscillator (VCO) 540, operating at a constant 2 GHz output frequency. Tuning of the output frequency from the BAW resonator VCO 540 to keep a stable output is accomplished using a varactor and parallel switched capacitor banks on the CMOS device. The BAW resonator VCO 540 is preferable over an inductor-capacitor (LC) tank for noise, thermal stability, and vibration performance. Since the BAW resonator VCO 540 provides a significantly higher-Q load, a much lower phase noise and VCO power consumption may be achieved versus an LC VCO. The BAW resonator VCO 540 may be utilized to determine the clock stability over the frequency offset range 10 Hz to 10 KHz. In order to enable a 10 Hz loop bandwidth in a small size, the loop gain of PLLA 510 must be low such that capacitors used in the loop filter will be minimized. To minimize the loop gain of PLLA 510, both the charge pump current and the VCO tuning gain ($K_{VCO}$) may be minimized while still meeting the required VCO tuning range to keep the output stable over temperature variation and drift. For example, for $K_{VCO}$=1 MHz/V and a charge pump current of 1 μA, the largest capacitor required is 9.4 μF. A tuning of 1 MHz/V is sufficient to allow the BAW resonator VCO 540 to be tuned by the ions to compensate for thermal drift and aging. A CMOS divider 550 will be included on-chip to provide a final output 50 MHz reference frequency 560 divided down from the BAW resonator VCO 540 of 2 GHz. An optimized PLLA 510 is expected to consume approximately 3 mW of power from a 1.8 V supply including linear regulator efficiency loss (1 mW reference buffer, 1 mW dividers, 1 mW VCO).

Figure 6:
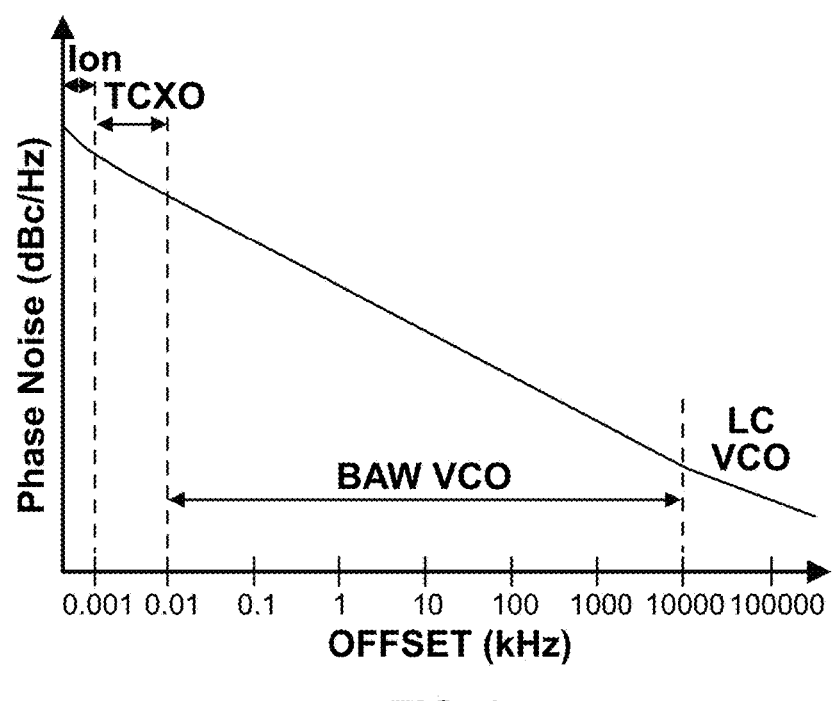
FIG. 6 illustrates the noise and noise sources for a bulk acoustic wave (BAW) resonator voltage controlled oscillator (VCO) that may be used with one or more embodiments of the present invention.

In PLLB 520, a CMOS fractional-N PLL is employed utilizing an LC VCO 570 with the 8 GHz output 530 for ion interrogation. The loop in PLLB 520 contains the same core components as PLLA 510, only with a larger charge pump output current, fractional-N tuning of the feedback divider, and an on-chip loop filter. The output of PLLA 510 is divided by 10, via divider 580 to provide a 200 MHz reference for PLLB 520. The target loop bandwidth of PLLB 520 was selected to be 10 MHz so as to suppress noise of the LC VCO 570 at large frequency offset, enable fast frequency hopping between ion interrogations, and enable on-chip integration. The fractional-N divider will enable the output frequency to be varied by less than 1 Hz as required for ion interrogation. The LC VCO 570 may, for example, employ an 8-shape inductor layout approach to limit EM radiation, and thus to prevent interference with ion interrogation. Both the charge pump and loop filter will preferably have digital tunability. A 50Ω CMOS output buffer 590 will apply the 8 GHz clock output to the ions during interrogation employing a switching-type power amplifier for optimal efficiency and output power less than-5 dBm. An output disable function is implemented on-chip in the LO chain inverters between the LC VCO 570 and the output buffer 590 to achieve ON/OFF ratios of >45 dB, which greatly exceeds performance of RF switches near this frequency range. The output disable function enables the PLLB 520 to stay powered up and in lock for fast interrogation of the ions. The complete phase noise profile of the 8 GHz ion interrogation output is shown in FIG. 6, where the ions dominate up to 1 Hz offset, the COTS VCTCXO to 10 Hz offset, the BAW resonator VCO 540 to 10 MHz offset, and the LC VCO 570 above 10 MHz offset in order to minimize noise applied to the ions. Note the final output 50 MHz reference frequency 560 has a similar phase noise profile but has no contribution from the LC VCO 570. The LO 500 is expected to consume 11 mW of power from 1 V and 1.8 V supplies, including linear regulator efficiency loss (1 mW reference path, 2 mW fractional divider, 2 mW output buffer 590, 6 mW LC VCO). In addition to meeting the aging, thermal stability, and vibration stability requirements, the LO 500 also features low phase noise and timing jitter performance required for various applications. The estimated volumes required for each LO 500 component are: PLLA 510 and PLLB 520 combined (<0.5 mm³), 10 Hz loop filter (0.3 mm³), BAW resonator VCO 540 (1 mm³).

Bulk Acoustic Wave Voltage Controlled Oscillators

Bulk acoustic wave resonators have high quality factors and high power handling, enabling exceptional close and far from carrier phase noise. These properties permit BAW resonators to produce low jitter clocks that consume <1 mW. BAW resonators can be thermally compensated such that they can reliably hold the clock output frequency vs. temperature for timescales of 100 ms (or 10 Hz). Similar to other microelectromechanical systems (MEMS) resonators, BAW resonators have extremely low mass compared to quartz crystals, resulting in improved vibration sensitivity. For example, some COTS TCXOs have achieved vibration sensitivities of $4\times10^{-12}$/g utilizing MEMS resonators, but these oscillators consume a significant amount of power. A High Overtone Bulk Acoustic Wave oscillator achieved a vibration sensitivity of $3.6\times10^{-11}$/g despite the resonator being rigidly embedded in the substrate.

The vibration sensitivity of mechanical oscillators is minimized by reducing the mass of the resonator and decoupling the resonator from acceleration induced strains. The volume of an acoustic resonator scales as $$V \propto f_0^{-3}.$$

Figure 7:
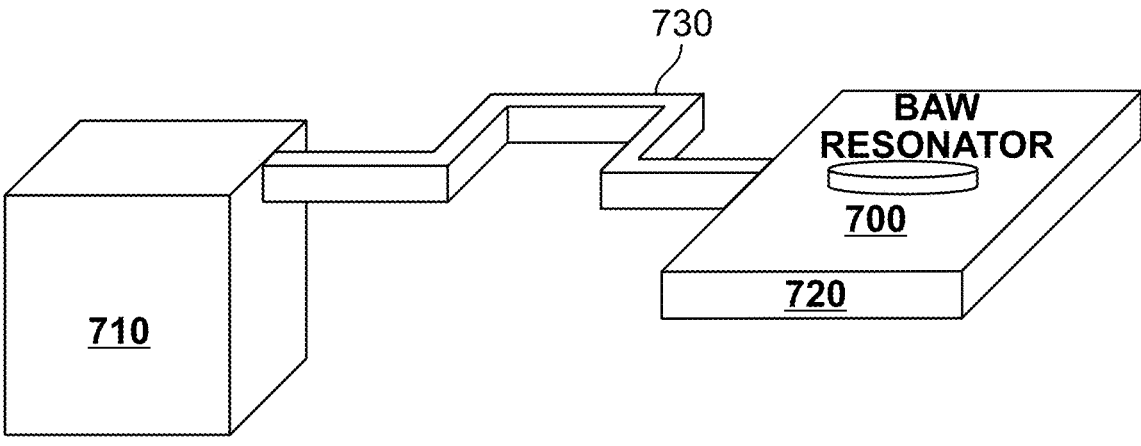
FIG. 7 illustrates a suspended bulk acoustic wave (BAW) resonator that may be used with one or more embodiments of the present invention.

By operating one or more embodiments at a high frequency of 2 GHz, the BAW resonator occupies an extremely small volume of $<4\times10^{-6}$ mm³. The ultra-low mass (<13 nanogram) ensures a low inertial force on the BAW resonator itself. Vibration sensitivity is minimized by ensuring that acceleration induced strains on the substrate do not induce strains in the BAW resonator through the anchoring structure. This is a weakness of prior designs that were rigidly attached to the substrate. One or more embodiments employ an Aluminum Nitride (AlN)/Aluminum Scandium Nitride (AlScN) membrane type BAW resonator 700, which is isolated from inertial forces on the substrate 710 by suspending the BAW resonator 700 on a MEMS vibration isolation platform 720 as illustrated in FIG. 7. In this approach, the BAW resonator 700 is free to move under acceleration, but the vibration induced strains on the platform 720 are absorbed by a low stiffness cantilever anchoring support (suspension) 730, while any strains induced in the substrate 710 are not transferred to the isolated platform 720 due to the folded nature of the cantilever anchoring support 730. Note that while the illustrated embodiment employs a single cantilever anchoring support 730, other embodiments may include a plurality of cantilever anchoring supports. Note that the electrical interconnect impedance between the BAW resonator 700 and sustaining oscillator circuit should not meaningfully vary under vibration. The overall BAW resonator structure may be solder attached directly to the ASIC circuit to eliminate any wire bond inductance, which is well known to vary under vibration. The impedance of the resonator is preferably tailored to have a large motional inductance, such that changes in interconnect inductance have minimal impact on the resonant frequency. Finally, the electrical interconnects (not shown) on the cantilever anchoring support 730 are preferably routed such that the overall change in the interconnect resistance with acceleration is minimal. For example, the interconnect may be routed on both the top and bottom of the cantilever anchoring support 730 so any out-of-plane cantilever bending causes the resistance of the top interconnect to increase (because it is in tension), and the bottom interconnect to decrease (because it is in compression). Since these interconnects are in series, the net impact will be zero change in series interconnect resistance. By utilizing high coupling AlN/AlScN piezoelectric materials, very low phase noise can be achieved while consuming less than 1 mW.

Trap Drive

One or more embodiments employ an RF frequency in the range of approximately 1-5 MHz, which requires a voltage of approximately +200 V AC. Prior art ion trap drivers relied on a high-Q wire-wound inductor and required 40 mW of power and 2 $cm^3$. Both the power and volume consumed by the trap drive may be significantly reduced by utilizing a piezoelectric transformer. Piezoelectric transformers are more power and area efficient and can achieve higher voltage gains than inductors owing to their high quality factors. The peak voltage gains for a given piezoelectric material and mode shape is realized when the resonator shunt ($C_S$) and load (in this case the trap) capacitances are equal. The maximum optimized gain then depends on the product of the electromechanical coupling ($K^2$) and the Q of the resonator. A piezoelectric transformer that can boost CMOS compatible output voltages to ±200 V AC is preferred. Piezoelectric transformers offer a drastic reduction in both power and size when driving the measured trap capacitance and resistance compared to inductive boost circuits. They are also compatible with CMOS driving voltages. Simulation of a $LiNbO_3$ piezoelectric transformer shows that with a volume of 0.012 mL and an average source power of 3.7 mW can achieve the desired ±200 V AC output. In addition to their small size and power efficiency, the piezoelectric transformers do not generate magnetic fields, which is important for trap miniaturization.

Figure 8A:
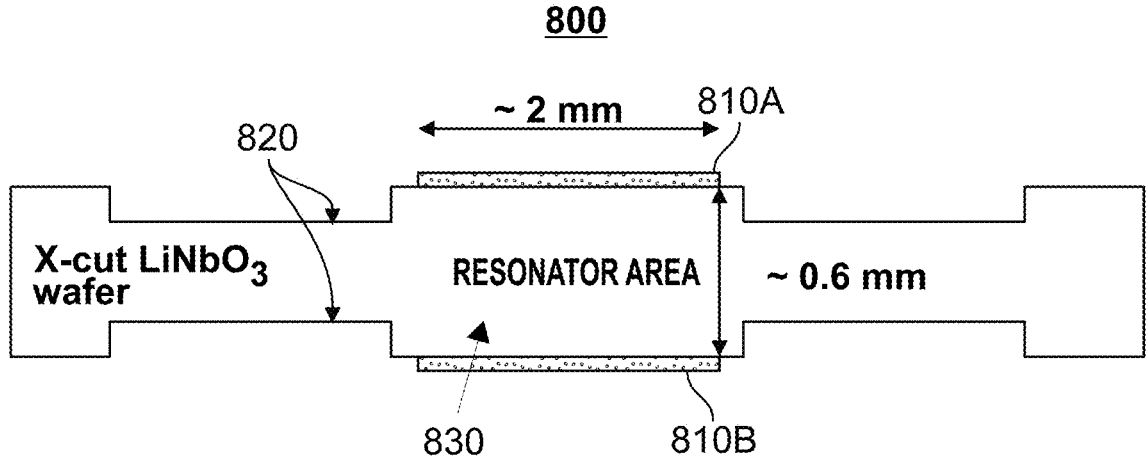
FIGS. 8A and 8B illustrate cross-sectional and plan views of a piezoelectric transformer that may be used with one or more embodiments of the present invention.
Figure 8B:
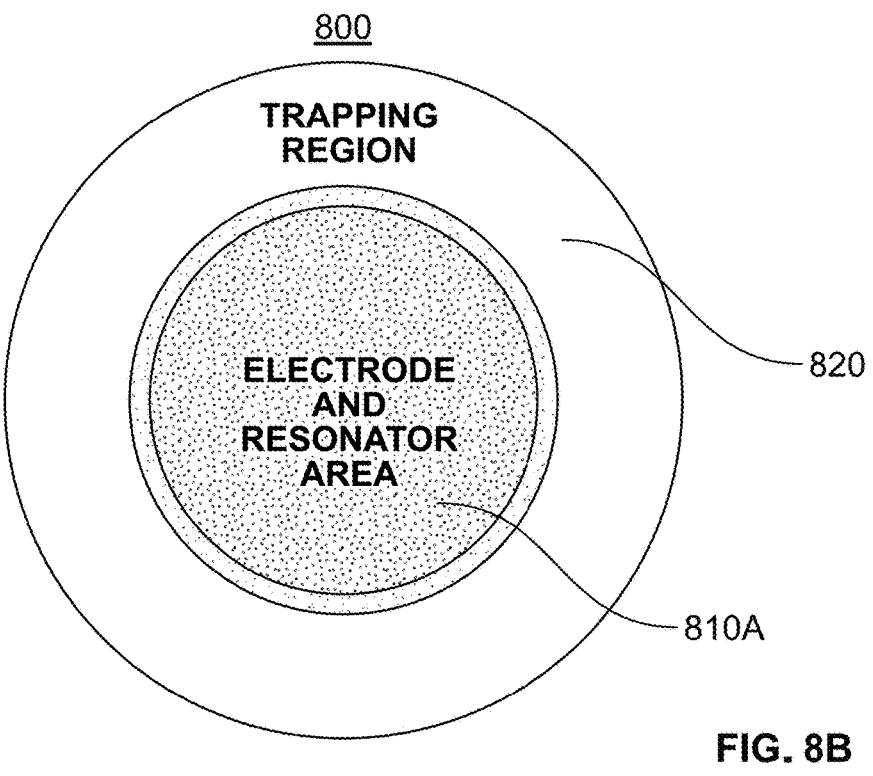

FIGS. 8A and 8B illustrate cross-sectional and plan views of a $LiNbO_3$ based piezoelectric transformer 800, formed from a double-side polished, X-cut, $LiNbO_3$ wafer. The transformer resonant structure is realized via a thickness shear mode vibrating between the top and bottom surfaces of the wafer, with a resonant frequency of $f_{RF}$=c/2t, where c=3676 m/s is the shear wave velocity in X-cut $LiNbO_3$, and t is the wafer thickness. X-cut $LiNbO_3$ wafers are commercially available with thicknesses of 0.4, 0.5, 0.825, and 1 mm, allowing the frequency to be tailored between approximately 4.6 and 1.8 MHz. Electrodes 810A, 810B are deposited, aligned, and patterned on both sides of the wafer, respectively, with a nominal diameter between approximately 1.6 and 2.54 mm depending on the chosen thickness t. To ensure a high Q factor, an energy trapping structure 820 will be etched and/or deposited and patterned around the perimeter of the resonator 830. By confining the acoustic energy for high Q and using a high $K^2$ shear mode in $LiNbO_3$ to form a high-gain resonant transformer, reductions in trap drive volume and power consumption can be achieved.

Application Specific Integrated Circuit

Figure 9:
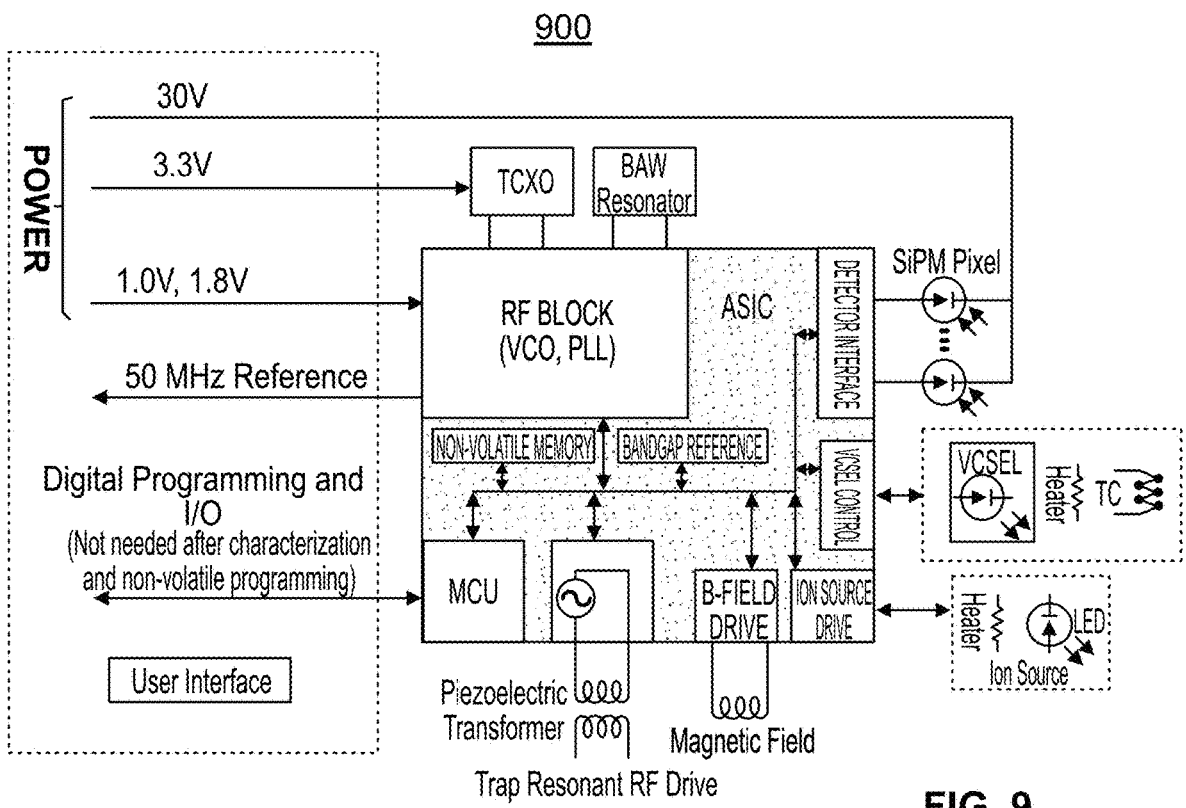
FIG. 9 illustrates an application specific integrated circuit (ASIC) that may be used with one or more embodiments of the present invention.

To minimize the size and required power for the overall atomic clock, the necessary electrical and control functions must be miniaturized and operate at very low power. The functions can be split into RF circuitry and low-speed control circuitry. An ASIC 900, such as that illustrated in block diagram form in FIG. 9, may efficiently implement all RF, electronic, and control functions. The use of the single ASIC 900 will drastically reduce I/O count and power that would otherwise be necessary in a multi-component electronics approach. The user interface consists of four power supply rails and a digital programming and I/O bus required for test, debug, and initial device tuning. For normal operation, use of this interface is not required.

The master control unit (MCU) will implement all modes and control sequences for the atomic clock. Potential modes include startup, normal operations, and test. Startup mode will provide the sequencing of control events necessary to bring the atomic clock up to operating mode from a cold start. Normal operating mode will implement the RF frequency control loop by driving the TCXO control voltage and VCSEL temperature based on feedback from photodetector counts. Test mode will allow visibility into the performance of individual components, such as VCSEL power and temperature, oscillator performance, and SiPM detector dark count rates. Implementation of these functions will require integration of a bandgap reference, digital-to-analog converters (DACs) and analog-to-digital converters (ADCs). The MCU is preferably implemented as a finite state machine to realize the required control sequences and will have programmable calibration tables and branching and repeat options in its control algorithms. Once the ASIC 900 has been tuned to a particular physics package, the tuned configuration parameters can be programmed into non-volatile memory allowing startup and normal operation sequence upon power application to the atomic clock.

The ASIC 900 will preferably employ silicon-on-insulator (SOI) technology to isolate RF from control functions. The ASIC 900 will preferably also include a 30V detector bias source. This would necessitate incorporation of another oscillator within the ASIC and integration of a miniature step-up transformer, which may be implemented as another piezoelectric device.

Component Integration

Atomic clocks in accordance with various embodiments require the heterogeneous integration (HI) of seven main components with unique requirements for size and power. Chip on board and high density interconnect (HDI) technology will be the primary solution for an interposer that electrically and mechanically connect the components. This may be implemented using a combination of conductive and non-conductive epoxy to bond the different integrated chips (ICs) and modules to the interposer. Both wire bonds and solder will be used to make electrical connections. Due to the miniature size of the IC technologies, a printed circuit board (PCB) based interposer may be employed. Flip chip technology may be employed with one or more embodiments to reduce the final volume. PCB based interposers may provide the best performance and greatest design flexibility with regards to integration for various embodiments. PCB and HDI interposers can utilize both flip chip and/or wire-bond technology for volume reduction simultaneously with surface mount technologies for high performance. The wide material selection also provides higher RF and thermal performance while allowing for both ball grid array and connectorized connections. Mounting the VCSEL, ionizing light source, and SiPM relative to the vacuum package may be challenging. The ionizing light source and SiPM may be bare die to minimize the distance to the ion trap. To ensure maximum SNR, the VCSEL may need to be actively aligned to the ions in the ion trap.

All publications, including but not limited to patents and patent applications, cited in this specification are herein incorporated by reference as though set forth in their entirety in the present application.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A miniature trapped ion atomic clock, comprising:
a vacuum package, the vacuum package including:
    a body, the body including at least one turning mirror adapted to reflect an excitation laser beam toward an ion cloud, one or more emitters adapted to release atoms upon heating of the one or more emitters, a plurality of electrodes adapted to trap the ion cloud, a getter adapted to control a vacuum level in the vacuum package, and a plurality of electrical feed-throughs adapted to facilitate operation of the one or more emitters and the plurality of electrodes; and
    a lid, the lid including a viewport adapted to transmit the excitation laser beam and ionic fluorescence emitted by the ion cloud upon excitation by the excitation laser beam;
an optoelectronics package, the optoelectronics package including:
    a laser adapted to generate the excitation laser beam;
    a fluorescence photodetector adapted to detect the ionic fluorescence;
    a local oscillator (LO) adapted to output a clock signal and a radio frequency (RF) signal, the LO including two phase-locked loops (PLLs);
    a trap drive adapted to receive the RF signal, the trap drive adapted to amplify the RF signal using a transformer, the thus amplified RF signal adapted to drive one or more of the electrodes;
    an application specific integrated circuit (ASIC) adapted to implement electrical and control functions required to operate the miniature trapped ion atomic clock; and
    an interposer wherein the laser, the fluorescence photodetector, the LO, the trap drive, and the ASIC are mounted to the interposer; and
an ionizing source adapted to ionize the thus released atoms, the thus released atoms forming the ion cloud;
wherein the optoelectronics package is mechanically, electrically, and optically coupled to the vacuum package.

2. The miniature trapped ion atomic clock of claim 1, wherein:
    at least a first portion of the body is formed of a high temperature co-fired ceramic (HTCC); and
    at least a second portion of the body is formed of titanium.

3. The miniature trapped ion atomic clock of claim 1, wherein the one or more emitters are adapted to release Ba atoms.

4. The miniature trapped ion atomic clock of claim 3, wherein the excitation laser beam has a wavelength of approximately 455 nm.

5. The miniature trapped ion atomic clock of claim 1, wherein at least one of the plurality of electrodes includes a plurality of holes therethrough, the plurality of holes adapted to pass at least one of the thus released atoms or the thus ionized atoms from the one or more emitters to the ion cloud.

6. The miniature trapped ion atomic clock of claim 1, wherein the getter is a non-evaporable getter.

7. The miniature trapped ion atomic clock of claim 1, wherein:
    at least a portion of the lid is formed of a non-magnetic material; and
    at least a portion of the viewport is formed of sapphire.

8. The miniature trapped ion atomic clock of claim 1, wherein at least a portion of the viewport includes an antireflection (AR) coating adapted to pass the excitation laser beam.

9. The miniature trapped ion atomic clock of claim 1, wherein at least a portion of the viewport includes a band-pass coating adapted to pass the ionic fluorescence and block the excitation laser beam.

10. The miniature trapped ion atomic clock of claim 1, wherein the body and the lid are hermetically sealed to one another using a solder.

11. The miniature trapped ion atomic clock of claim 1, wherein the laser is a vertical cavity surface emitting laser (VCSEL).

12. The miniature trapped ion atomic clock of claim 1, wherein the ionizing source includes one of an ultraviolet (UV) light emitting diode (LED), a UV laser, or a field emitter array.

13. The miniature trapped ion atomic clock of claim 1, wherein the fluorescence photodetector includes a silicon photomultiplier (SiPM).

14. The miniature trapped ion atomic clock of claim 1, wherein the optoelectronics package further includes a power photodetector, the power photodetector adapted to detect the excitation laser beam after the excitation laser beam passes through the ion cloud.

15. The miniature trapped ion atomic clock of claim 1, wherein at least one of the two PLLs includes a voltage controlled oscillator (VCO) with a bulk acoustic wave (BAW) resonator.

16. The miniature trapped ion atomic clock of claim 15, wherein a vibration sensitivity of the BAW resonator is reduced through the use of one or more cantilever anchoring supports.

17. The miniature trapped ion atomic clock of claim 15, wherein the BAW resonator is formed, at least in part, of a piezoelectric material.

18. The miniature trapped ion atomic clock of claim 1, wherein the transformer is a piezoelectric transformer.

19. The miniature trapped ion atomic clock of claim 18, wherein the piezoelectric transformer includes an energy trapping structure.

20. The miniature trapped ion atomic clock of claim 1, wherein at least one of the interposer includes a printed circuit board (PCB) or the interposer employs high density interconnect (HDI) technology.

* * * * *